United States Patent [19]
Bergam et al.

[11] Patent Number: 5,658,028
[45] Date of Patent: Aug. 19, 1997

[54] VERTICAL WAFER CARRIER HANDLING APPARATUS

[75] Inventors: Gregory D. Bergam, Ontario, Oreg.; Dennis L. Veatch, Meridian; Mark R. Anderson, Boise, both of Id.

[73] Assignee: Micron Technology, Inc., Boise, Id.

[21] Appl. No.: 595,746

[22] Filed: Feb. 2, 1996

[51] Int. Cl.$^6$ .................................................. B65D 25/28
[52] U.S. Cl. ............................ 294/27.1; 294/15; 294/163
[58] Field of Search ............................... 294/1.1, 15, 16, 294/27.1, 28, 33, 34, 87.1, 159, 162, 163, 165; 16/114 R; 118/500; 206/454–456, 557, 564, 711; 211/40, 41

[56] References Cited

U.S. PATENT DOCUMENTS

| | | | |
|---|---|---|---|
| 3,939,973 | 2/1976 | Wallestad | 294/27.1 X |
| 4,520,934 | 6/1985 | Aigo | 294/27.1 X |
| 4,595,222 | 6/1986 | Schumacher | 294/16 |
| 5,029,922 | 7/1991 | DiNapoli et al. | 294/27.1 |
| 5,364,144 | 11/1994 | Satterfield et al. | 294/27.1 |
| 5,390,972 | 2/1995 | Galloway | 294/27.1 |

*Primary Examiner*—Johnny D. Cherry
*Attorney, Agent, or Firm*—Kirkpatrick & Lockhart LLP

[57] ABSTRACT

An apparatus for efficiently and safely loading, unloading and transporting vertically oriented wafer carriers. The apparatus includes a body having a front and a back face, a top portion and a first and a second side, two horizontally aligned handles mounted to respective first and second sides on the front face of the body. The apparatus further includes an arm having a fixed end attached to the top portion of the back face of the body and a free end containing a slot, extending from the free end toward the fixed end, of dimensions suitable to slidably receive the carrier handle and to restrain movement of the carrier parallel to the back face of the body and a top surface. The top surface has a recessed portion suitable for retaining the handle of the wafer carrier and restraining movement of the carrier perpendicular to the back face and the recessed portion is sufficiently proximate to the back face that the back face will prevent the removal of a wafer contained in the carrier when the carrier handle is retained in the recessed portion. In a preferred embodiment, the body is substantially rectangular and has two rectangular portions cut out symmetrically about the vertical centerline of the body to reduce the weight of the apparatus and which define a middle support and a bottom portion.

18 Claims, 3 Drawing Sheets

VERTICAL WAFER CARRIER HANDLING APPARATUS

BACKGROUND OF THE INVENTION

1. Field of the Invention

The present invention relates to devices useful for lifting and removing objects from spaces where access is restricted. More particularly, the present invention relates to detachable wafer carrier handle assemblies and combinations thereof for use in loading and unloading vertical wafer carriers into and out of equipment and transporting the wafer carriers between equipment.

2. Description of the Invention Background

Semiconductor devices such as transistors, are commonly mass produced by simultaneously forming a plurality of semiconductor devices on a wafer shaped substrate, or wafer, composed of a semiconductor material, such as monocrystalline silicon. The processed wafers are then cut up to separate the individual devices for use in a variety of applications. Many of the processing steps in the formation of semiconductor devices are not amenable to continuous processing and, therefore, must be processed in batch type processing stages, which tend to lower production capacity due to process downtime involved with loading, unloading and transporting the batches. Processing equipment has been designed to increase production capacity by simultaneously or continuously treating a number of wafers in a semi-batch processing mode. The wafers are processed in bulk through the use of wafer carriers that have been designed to hold and separate a plurality of wafers allowing for the simultaneous or continuous processing of the batch. The wafer carriers also serve to minimize the need for human contact with the wafers during processing which could result in contamination of the wafers. Various designs and material of construction are used in the wafer carriers depending upon the processing stages in which the wafer carrier is to be used, but in most carriers generally consist of a base containing a plurality of slots or grooves that serves to separate the wafers in a cassette-type arrangement.

Two different types of materials are commonly used for wafer carriers in the industry. In high temperature processing steps, greater than about 200° C., wafer carriers are often made from a plurality of quartz or other temperature resistant rods that form a "basket" or "rack" for supporting the wafers. In low temperature processing steps, wafer carriers are typically made of molded plastics, such as polytetrafluoroethylene (Teflon®) or polypropylene. In addition to temperature considerations, the carrier design is dependent upon the processing step in which the carrier is used. Some carriers, known as low profile carriers, are designed to provide relatively unrestricted access to the wafers within the carrier. Other carriers, known as high profile carriers, are designed to more fully enclose and protect the wafers.

One limiting aspect of the overall production capacity of the semiconductor devices is the time involved in loading and unloading the wafer carriers in the equipment for each batch type processing stage and transferring the wafer between stages. In addition, these handling operations also greatly increase the potential for physical damage to and contamination of the wafers. In most instances, the wafers are generally stored and transported in the carriers in which the wafers are in a vertically upright, horizontally spaced array. However, in a number of processes the faces of the wafers must be horizontally oriented and the wafers must be loaded into the equipment using a vertical wafer carrier in which the faces of the wafers are oriented horizontally, in a vertically spaced array.

Vertical wafer carriers typically have one end that contains a handle to enable the carrier to be lifted in a stable manner. The opposite end of the carrier is designed so that the carrier can stand on end. The wafer processing equipment typically must be loaded from either the top or the side of the equipment. In top loading equipment, the vertically oriented carrier can be lowered into the processing equipment by the handle of the carrier in a stable, controlled manner. However, when loading a vertical carrier horizontally into side loading equipment, the vertical carrier generally can not be held by the handle from above the carrier within the confines of the processing equipment and the carrier must be supported in a different manner. Supporting the carriers from below the opposite end of the carrier or the handle, or by the sides imparts instability to the carrier and requires precise control of the carrier to avoid tilting the carrier during the loading and unloading operation that could result in dumping the wafers out of the carrier or wedging the carrier in the equipment.

One prior method of manipulating carriers having an open handle extending from their upper surface included the use of a removable handle. Such handle included a T-shaped frame having a single handle extending from one side of the vertical member of the T. Two spaced elongated wedge members extend from the other side of the horizontal member of the T. The wedge members serve to engage the handle on the carrier. This method, however, was flawed in that it required a user to manipulate a rather heavy carrier filled with wafers with only one hand. This proved to be strenuous and has led to dropping of carriers and wafers.

The present invention is directed to providing an apparatus to efficiently and safely load and unload a vertically oriented wafer carrier in a substantially horizontal direction which overcomes, among others, the above-discussed problems so as to increase the stability, efficiency and safety of the loading and unloading of vertically oriented wafer carriers.

SUMMARY OF THE INVENTION

The above objects and others are accomplished by a wafer carrier handling apparatus in accordance with the present invention. The wafer carrier handling apparatus of the present invention is provided for efficiently and safely loading, unloading and transporting vertically oriented wafer carriers. The apparatus includes a body having a front and a back face, a top portion and a first and second sides, and two horizontally aligned handles mounted to respective first and second sides on the front face of the body. The apparatus further includes an arm having a fixed end attached to the top portion of the back face of the body and a free end containing a longitudinal slot extending from the free end toward the fixed end, and having dimensions suitable to slidably receive the carrier handle and to restrain movement of the carrier parallel to the back face of the body and a top surface. The top surface of the arm has a recessed portion suitable for retaining the handle of the wafer carrier and restraining movement of the carrier perpendicular to the back face and the recessed portion is sufficiently proximate to the back face that the back face will prevent the removal of a wafer contained in the carrier when the carrier handle is retained in the recessed portion. In a preferred embodiment, the body is substantially rectangular and has two rectangular portions symmetrically cut out about the vertical centerline of the body to reduce the weight of the apparatus and which defines a middle support and a bottom portion. Also in a preferred embodiment, the length and width of the body are no larger than the length and width of the wafer carrier, so as to enable the apparatus to be used in equipment where access is limited to the area occupied by the carrier.

Accordingly, the present invention provides effective solutions to the problems present in the handling of bulk quantities of wafers in a vertical wafer carrier. In particular, the subject invention greatly improves the stability and safety of the handling operations, while simplifying the procedure for handling. Also, the use of the present invention involves a sequence of one dimensional steps that allow the present invention to be more easily integrated into a fully automated procedure. Thus, the present invention can provide for a reduction in the overall cost associated with the production of the wafers by providing for a more efficient procedure to move bulk quantities of wafers into, out of and between batch processes. These and other details, objects, and advantages of the invention will become apparent as the following detailed description of the present preferred embodiment thereof proceeds.

BRIEF DESCRIPTION OF THE DRAWINGS

The preferred embodiment of the present invention will be described in greater detail with reference to the accompanying drawings, wherein like members bear like reference numerals and wherein.

DETAILED DESCRIPTION OF THE PREFERRED EMBODIMENTS

Figure 1:
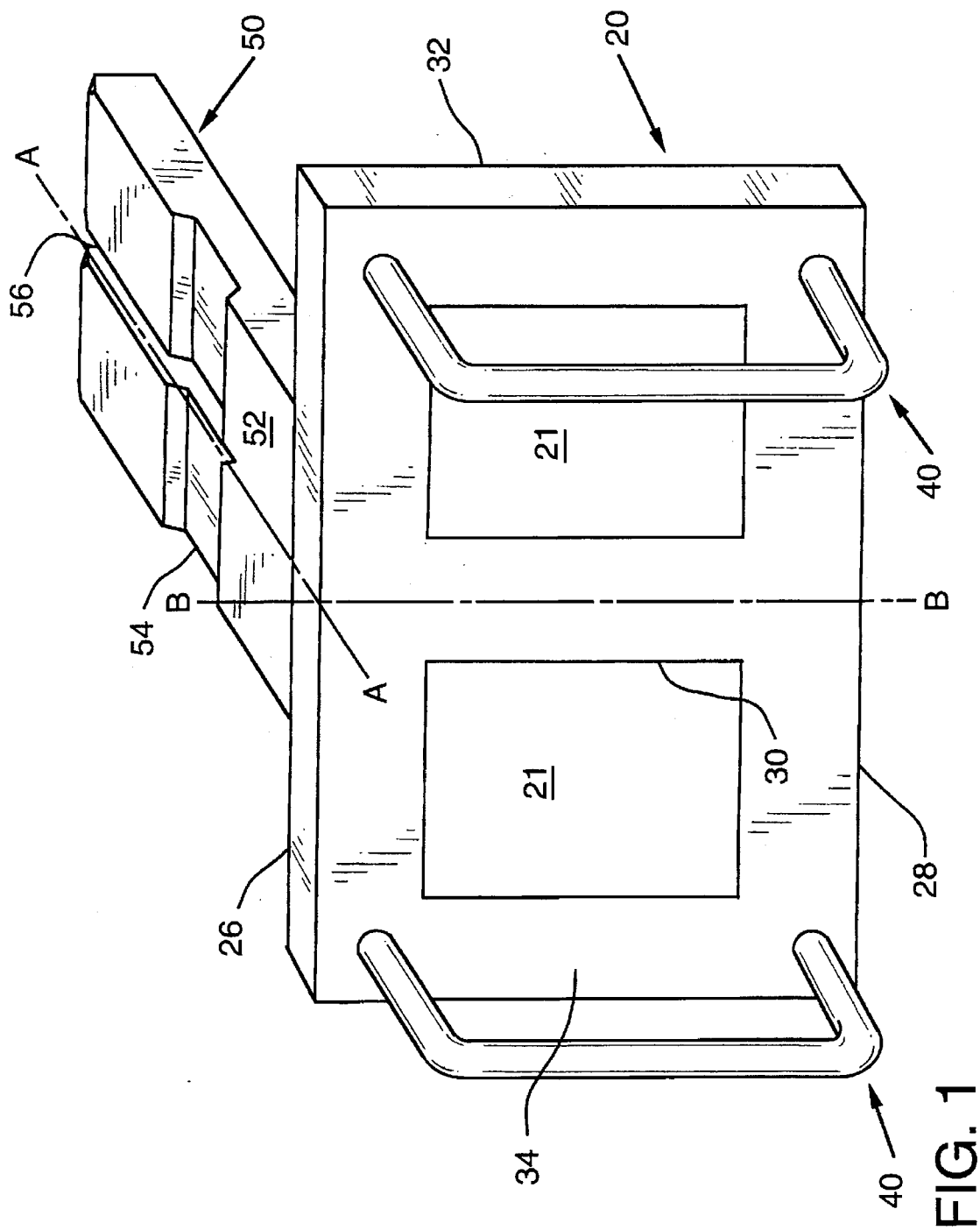
FIG. 1 is a front perspective view of a preferred embodiment of the present invention.
Figure 2:
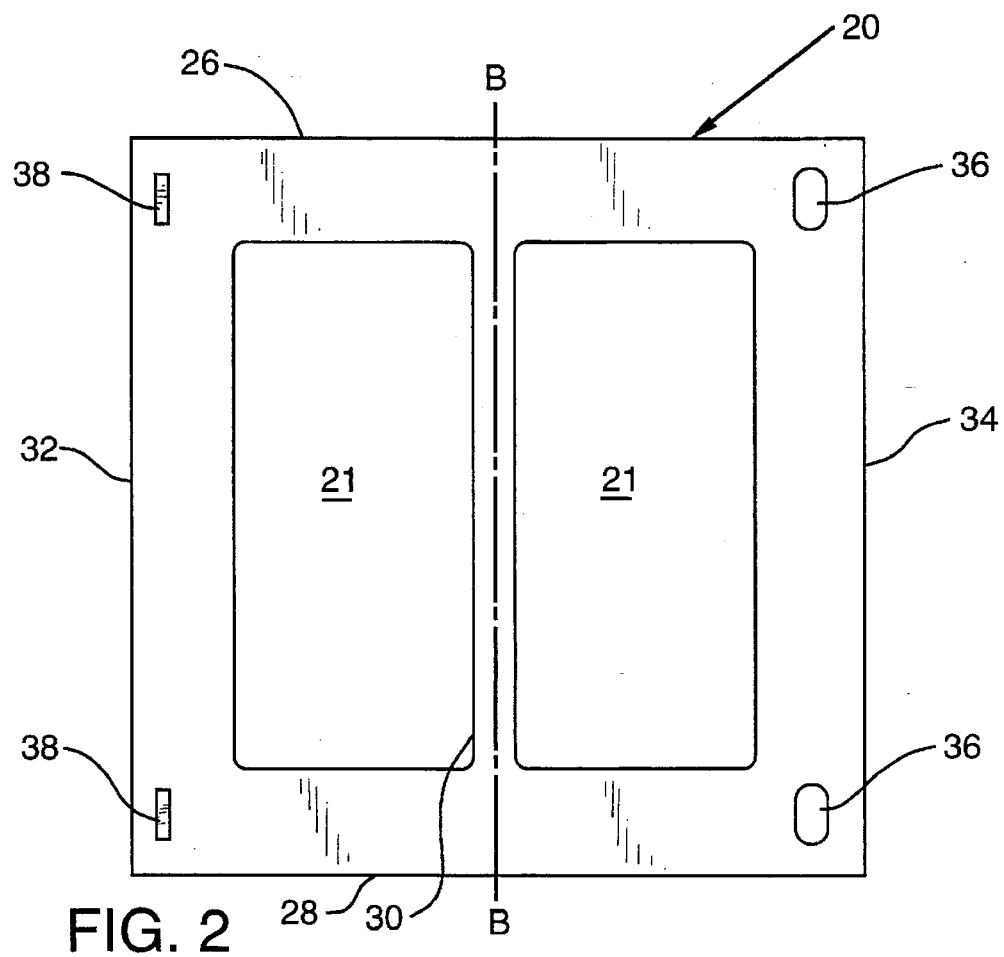
FIG. 2 is a back side view of the body member in a preferred embodiment of the present invention.
Figure 3:
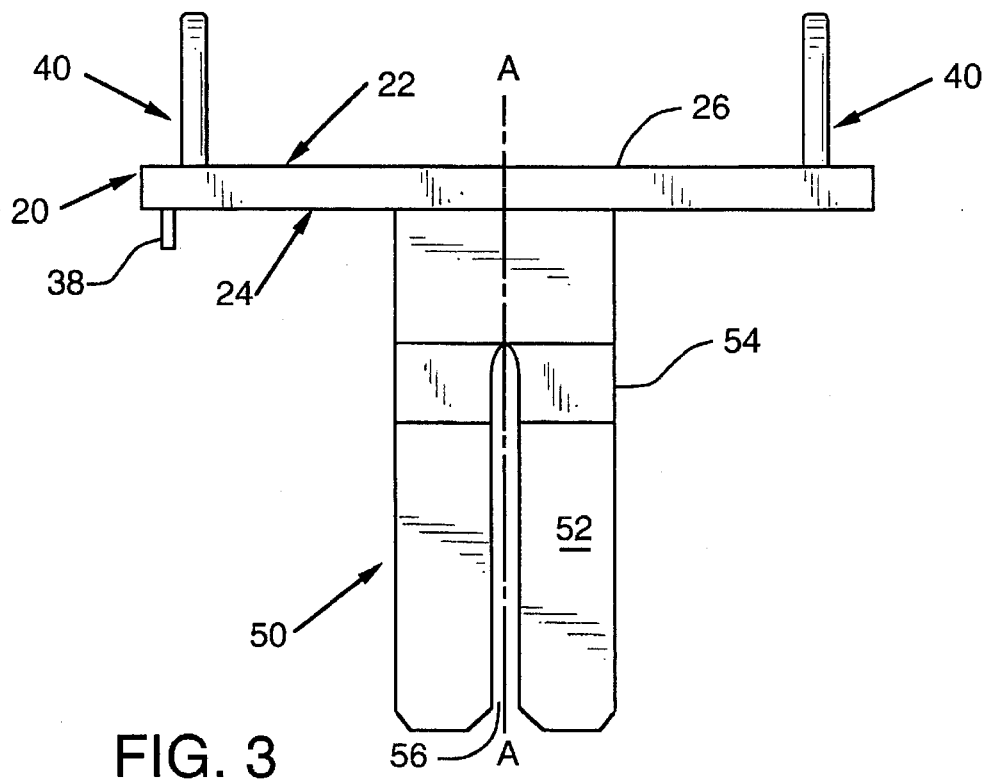
FIG. 3 is a top view of a preferred embodiment of the present invention.

The operation of the wafer carrier handling apparatus 10 will be described generally with reference to the drawings for the purpose of illustrating present preferred embodiments of the invention only and not for purposes of limiting the same. The apparatus 10 includes a body 20, two handles 40 attached to the front face of the body 20 and an arm 50 attached to the back face of the body 20 for supporting a wafer carrier 70. A preferred embodiment is described with reference to a wafer carrier 70 having a handle end 74 with a carrier handle 72 attached thereto, and a support end 76. Additionally, the carrier 70 can further include a carrier handle support 78 attached between the carrier handle 72 and the handle end 74 and alignment tabs 75 and slots. The carrier 70 may have approximate dimensions of, for example, 8.5 inches wide by 8 inches high by 7.5 inches deep, for an eight inch diameter wafer.

Figure 4:
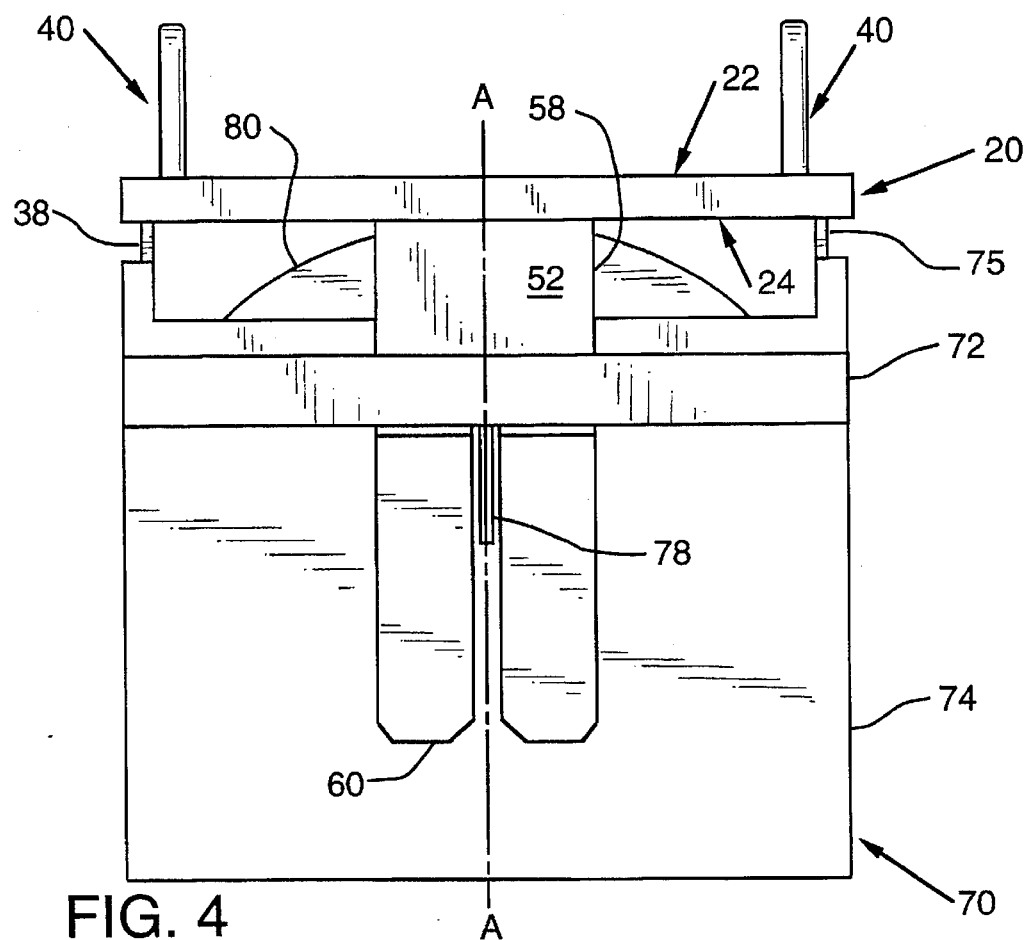
FIG. 4 is a top view of a preferred embodiment of the present invention holding a cassette containing wafers; and, FIG. 5 is a side view of a preferred embodiment of the present invention supporting a wafer carrier.
Figure 5:
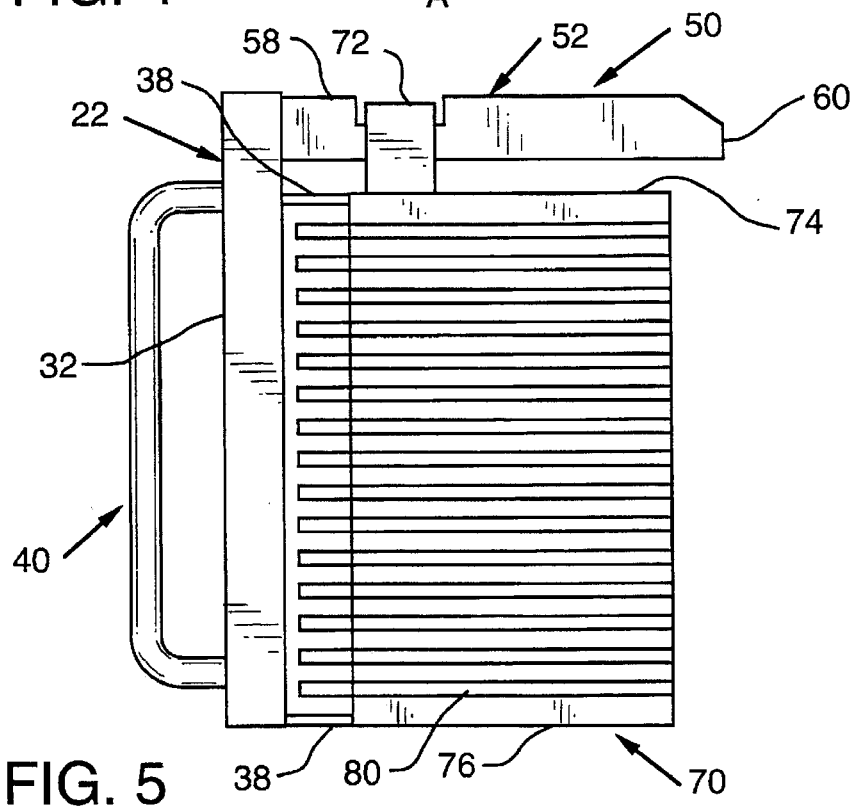

In a preferred embodiment, the body 20 is substantially rectangularly shaped having a front face 22 and a back face 24 that can be dimensionally characterized by a width and a length. The carrier 70 can also be dimensionally characterized as having a width and a length. Preferably, the length and the width of the body 20 are no larger than the length and the width of the wafer carrier 70, as shown in FIGS. 4 and 5, so that the apparatus 10 can be used to load and unload a wafer carrier 70 from equipment in which the maximum area available is defined by the size of the wafer carrier 70. Preferably, the body 20 is constructed from a solid piece of material having a uniform thickness, such as ½" thick polypropylene, in which two large rectangular portions 21 symmetrically disposed about the vertical centerline, B—B, of the body 20 have been cut out so as to define a top portion 26, a bottom portion 28, a middle support 30 and first and second sides, 32 and 34, respectively. The use of body 20 containing cut out portions 21 is preferred over a complete solid body 20, so that higher strength material, which in most instances involves higher densities, can be used to construct the body 20 without substantially increasing the overall weight of the apparatus 10. It is also preferred that edges defining the cut out portions 21 are parallel to the perimeter of the body 20 and the corners are rounded in order to minimize the potential for uneven force distributions when a wafer carrier 70 is lifted.

The body 20 preferably contains a middle support 30 disposed about the vertical centerline, B—B, to provide structural strength in the plane containing the arm 50 and to prevent the wafers 80 from sliding out of the wafer carrier 70 during the handling of the wafer carrier 70 with the apparatus 10. The first and second sides, 32 and 34, respectively, are preferred to provide structural support for the body 20 near the handles 40 or alternatively for mounting the handles 40. The body 20 can alternatively be any other geometric shape, such as circular, which would be suitable to achieve the objective of the invention and can be constructed using separate members for the top portion 26, the bottom portion 28, the middle support 30 and the two sides, 32 and 34, respectively, and for combinations thereof.

In a preferred embodiment, recessed slots 36 are provided in the back face 24 of the body 20 to mate with alignment tabs 75 on the carrier 70 and to provide an additional restraining mechanism on the movement of the carrier 70. However, the recessed slots 36 must be of dimensions sufficient to allow limited movement of the alignment tabs 75 during the raising and lowering of the apparatus 10 relative to the carrier 70. Additionally, tabs 38 can be mounted to the back face 24 to mate with alignment slots in the carrier 70 to further secure the carrier in the apparatus 10 subject, however, to the same dimensional requirement necessary to allow relative movement between the apparatus 10 and the carrier 70.

Two generally C-shaped handles 40 are used in a preferred embodiment to lift the apparatus 10 and have substantially right angles formed between their intersecting legs. Preferably, the handles 40 are mounted parallel to each other in close proximity to the first and second sides, 32 and 34, respectively, on the front face 22 of the body 20. In addition, the handles 40 are horizontally aligned and symmetrically disposed about the vertical centerline, B—B, to provide handling stability. The separation and orientation of the handles 40 in this way prevents the use of the apparatus 10 with only one hand, which serves to reduce accidental dumping of the wafers and injuries to personnel resulting from careless handling operations. The handles 40 are constructed using stainless steel in order to provide sufficient structural strength for handling the wafer carriers and are mounted by conventional methods, such as screws. For example, ¾" 300 Series stainless steel was found to provide sufficient strength for use with handling eight inch diameter wafers in an eight inch long wafer carrier 70. While it is preferred that a C-shaped handle 40 is used to provide for the distribution of the load over the body 20 as well as for stability, other handle embodiments, such as handles with only a single attachment point or multiple handle embodiments, can be used within the scope of the invention.

The arm 50 is preferably an elongated rectangular member extending from the back face 24 of the top portion 26 and having a top surface 52 containing a lateral recessed portion 54, a fixed end 58 and a free end 60 containing a slot 56. The fixed end 58 of the arm 50 is horizontally centered along the vertical centerline, B—B, near the top of the top portion 26 and is mounted to the back face 24 of the body 20 at substantially a right angle using conventional methods, such as screws. The arm 50 must be constructed from a material of sufficient strength to support the weight of the carrier 70 and the wafers 80 during the handling operations. For example, ¾" thick polypropylene was found to provide sufficient strength for use with handling eight inch diameter wafers in an eight inch long wafer carrier. The longitudinal centerline, shown as A—A, of the arm 50 extends substantially perpendicular to back face 24 and lies in a common plane with the vertical centerline, B—B, of the body 20. The slot 56 extends completely through the arm 50 perpendicular to the top surface 52 dividing the free end 60 symmetrically about the longitudinal axis A—A. The slot 56 extends longitudinally from free end 60 toward the fixed end 50 and terminates in the recessed portion 54. The edges of the free end 60 are preferably chamfered to facilitate the movement of the arm 50 through the carrier handle 72 and the entry of the carrier handle support 78 into the slot 56. The lateral dimension of the slot 56 is sized to allow a wafer carrier handle support 78 to move freely within the slot 56 in the longitudinal direction, but serves to restrain lateral movement of the wafer carrier 70 parallel to the back face 24 of the body 20. The recessed portion 54 serves to prevent longitudinal movement of the wafer carrier 70 that could result in damage to the wafers 80 from inadvertent contact with the back face 24 of the body 20 or if the carrier 70 were to slide off the arm 50 during the handling operations. Preferably, the recessed portion 54 extends laterally across the entire top surface 52 and the longitudinal extent and the depth of the recess portion 54 are sized to receive and retain a wafer carrier handle 72 during handling operations. The recessed portion 54 is longitudinally positioned so that a wafer 80 contained in the wafer carrier 70 will be in close proximity to the back face 24 of the body 20 to prevent wafers 80 from sliding out of the wafer carrier 70 during engagement with the apparatus 10. Additional restraint mechanisms so as to more securely lock the carrier handle 72 into place can be used in the present invention; however, the additional restraints are not currently preferred because of the remote use of the apparatus 10.

In the operation of the present invention, the wafer carrier 70 that is to be moved is originally seated on support end 76. The apparatus 10 is attached to the carrier 70 by grabbing the handles 40 with two hands and inserting the arm 50 through the opening in the carrier handle 72 so that the carrier handle support 78 is received in the slot 56 in the free end 60 of the arm 50, which restricts movement of the carrier 70 perpendicular to the slot 56. Insertion of the arm 50 through the carrier handle 72 is continued until the carrier handle 72 is vertically aligned with the recessed portion 54 of the arm 50 and carrier tabs 75 mate with the tab slots 36 in the back face 24 of the body 20. When the carrier handle 72 is aligned with the recessed portion 54, the handles 40 are used to lift the apparatus 10 such that the carrier handle 72 seats in the recessed portion 54, thereby preventing longitudinal movement of the carrier 70 and the weight of the wafer carrier 70 and wafers 80 is supported by the arm 50, as shown in FIGS. 4 and 5. The apparatus 10 and the carrier 70 can be moved in concert and the carrier 70 repositioned as desired. The apparatus 10 can be disengaged from the wafer carrier 70 by placing the support end 76 on a supporting surface and lowering the apparatus 10 until the weight of the carrier 70 and the wafers 80 is no longer supported by the arm 50, but by the support end 76, and the carrier handle 72 is no longer restrained in the recessed portion 54 of the arm 50. The arm 50 can then be withdrawn from within the carrier handle 72 and the carrier handle support 78 from the slot 56.

Those of ordinary skill in the art will appreciate that the present invention provides great advantages over the prior art for lifting and transporting vertically oriented carriers, especially when access to the carrier is limited to a substantially horizontal direction. In particular, the subject invention greatly improves the stability and safety of the handling operations, while simplifying the procedure for handling. Also, because use of the apparatus involves a sequence of one dimensional steps, the present invention can be more easily integrated into a fully automated procedure. Thus, the present invention can provide for a reduction in the overall cost associated with the production of the wafers by providing for a more efficient procedure to move bulk quantities of wafers between batch processes. While the subject invention provides these and other advantages over other apparatuses for handling wafer carriers, it will be understood, however, that various changes in the details, materials and arrangements of parts which have been herein described and illustrated in order to explain the nature of the invention may be made by those skilled in the art within the principle and scope of the invention as expressed in the appended claims.

What is claimed is:

1. A handling apparatus for a wafer carrier having an upper handle defining an opening, said apparatus comprising:

a body having a front face, a back face, a top portion, a first side and a second side;

a first handle attached to said first side of said front face;

a second handle attached to said second side of said front face, said second handle being horizontally aligned with said first handle; and, an arm adapted to be received in the opening in the handle, said arm including a fixed end attached to said top portion of said back face of said body, and a top surface having a recessed portion adapted to retain the handle of the wafer carrier and restrain movement of the carrier perpendicular to said back face, and said recessed portion is sufficiently proximate to said back face that said back face will prevent the removal of a wafer contained in the carrier when the carrier handle is retained in said recessed portion.

2. The apparatus of claim 1 wherein said body has a width no larger than the width of the carrier and a length no larger than the length of the carrier.

3. The apparatus of claim 1 wherein the carrier has alignment tabs and said body further comprises recessed slots positioned in said back face of said body and adapted to mate with the alignment tabs on the carrier.

4. The apparatus of claim 1 wherein the carrier has a carrier handle support extending from the carrier to the handle and said arm further comprises a free end remote from said fixed end and containing a slot extending from said free end toward said fixed end, said slot having dimensions suitable to slidably receive the carrier handle support and to restrain movement of the carrier handle support parallel to said back face.

5. The apparatus of claim 4 wherein said body has a width no larger than the width of the carrier and a length no larger than the length of the carrier.

6. The apparatus of claim 4 wherein the carrier has alignment tabs and said body further comprises recessed slots positioned in said back face of said body and adapted to mate with the alignment tabs on the carrier.

7. The apparatus of claim 6 wherein said body has a width no larger than the width of the carrier and a length no larger than the length of the carrier.

8. The apparatus of claim 7 wherein said body further comprises a bottom portion, and a middle support, and said middle support and said first and second sides connect said top portion to said bottom portion.

9. The apparatus of claim 8 wherein:

said top and bottom portions and said first and second sides are attached so as to substantially define a rectangular shape;

said middle support is connected at substantially right angles to said top and bottom portions;

said first and second handles are vertically oriented and parallel; and, said arm is substantially rectangular and elongated from said fixed end to said free end and said slot is chamfered at said free end.

10. A combination wafer carrier and detachable wafer carrier handling apparatus, comprising:

a wafer carrier, said wafer carrier comprising:

a partitioned base for supporting a plurality of wafer shaped material having a top end and bottom end, a handle attached to said top end so as to define an opening; and, detachable wafer carrier handling apparatus comprising:

a body having a front face, a back face, a top portion, a first side and a second side;

a first handle attached to said first side of said front face;

a second handle attached to said second side of said front face, said second handle being horizontally aligned with said first handle; and, an arm adapted to be received in the opening in the handle, said arm including a fixed end attached to said top portion of said back face of said body, and a top surface having a recessed portion adapted to retain the handle of the wafer carrier and restrain movement of the carrier perpendicular to said back face, and said recessed portion is sufficiently proximate to said back face that said back face will prevent the removal of a wafer contained in the carrier when the carrier handle is retained in said recessed portion.

11. The apparatus of claim 10 wherein said body has a width no larger than the width of the carrier and a length no larger than the length of the carrier.

12. The apparatus of claim 10 wherein the carrier has alignment tabs and said body further comprises recessed slots positioned in said back face of said body and adapted to mate with the alignment tabs on the carrier.

13. The apparatus of claim 10 wherein the carrier has a carrier handle support extending from the carrier to the handle and said arm further comprises a free end remote from said fixed end and containing a slot extending from said free end toward said fixed end, said slot having dimensions suitable to slidably receive the carrier handle support and to restrain movement of the carrier handle support parallel to said back face.

14. The apparatus of claim 13 wherein said body has a width no larger than the width of the carrier and a length no larger than the length of the carrier.

15. The apparatus of claim 13 wherein the carrier has alignment tabs and said body further comprises recessed slots positioned in said back face of said body and adapted to mate with the alignment tabs on the carrier.

16. The apparatus of claim 15 wherein said body has a width no larger than the width of the carrier and a length no larger than the length of the carrier.

17. The apparatus of claim 16 wherein said body further comprises a bottom portion, a middle support, and said middle support and said first and second sides connect said top portion to said bottom portion.

18. The apparatus of claim 17 wherein:

said top and bottom portions and said first and second sides are attached so as to substantially define a rectangle;

said middle support is connected at substantially right angles to said top and bottom portions;

said first and second handles are vertically oriented and parallel; and, said arm is substantially rectangular and elongated from said fixed end to said free end and said slot is chamfered at said free end.

* * * * *